(12) United States Patent
Bauer et al.

(10) Patent No.: US 7,944,061 B2
(45) Date of Patent: May 17, 2011

(54) SEMICONDUCTOR DEVICE HAVING THROUGH CONTACTS THROUGH A PLASTIC HOUSING COMPOSITION AND METHOD FOR THE PRODUCTION THEREOF

(75) Inventors: Michael Bauer, Nittendorf (DE); Thomas Bemmerl, Schwandorf (DE); Edward Fuergut, Dasing (DE); Simon Jerebic, Regensburg (DE); Christian Stuempfl, Schwandorf (DE); Horst Theuss, Wenzenbach (DE); Hermann Vilsmeier, Karlsfeld (DE)

(73) Assignee: Infineon Technologies AG, Neubiberg (DE)

( * ) Notice: Subject to any disclaimer, the term of this patent is extended or adjusted under 35 U.S.C. 154(b) by 554 days.

(21) Appl. No.: 11/575,851

(22) PCT Filed: Sep. 20, 2005

(86) PCT No.: PCT/DE2005/001652
§ 371 (c)(1),
(2), (4) Date: Sep. 9, 2008

(87) PCT Pub. No.: WO2006/032250
PCT Pub. Date: Mar. 30, 2006

(65) Prior Publication Data
US 2008/0315399 A1    Dec. 25, 2008

(30) Foreign Application Priority Data

Sep. 22, 2004   (DE) .................. 10 2004 046 227

(51) Int. Cl.
*H01L 23/48*    (2006.01)
*H01L 23/28*    (2006.01)

(52) U.S. Cl. .. 257/787; 257/774; 257/778; 257/E23.011
(58) Field of Classification Search .................. 257/787, 257/774, 724, E23.011
See application file for complete search history.

(56) References Cited

U.S. PATENT DOCUMENTS

| | | | | |
|---|---|---|---|---|
| 5,424,245 A | * | 6/1995 | Gurtler et al. ................ | 438/107 |
| 5,679,978 A | | 10/1997 | Kawahara et al. | |
| 5,870,289 A | * | 2/1999 | Tokuda et al. ................ | 361/779 |
| 6,476,503 B1 | | 11/2002 | Imamura et al. | |
| 6,939,738 B2 | * | 9/2005 | Nakatani et al. ............. | 438/108 |
| 6,949,822 B2 | * | 9/2005 | Shivkumar et al. ........... | 257/704 |
| 6,982,487 B2 | * | 1/2006 | Kim et al. .................... | 257/774 |
| 6,998,721 B2 | * | 2/2006 | Zhou ............................ | 257/790 |

(Continued)

FOREIGN PATENT DOCUMENTS

CN    1519931    8/2004

(Continued)

OTHER PUBLICATIONS

Richard R.A. Syms et al., "Surface Tension-Powered Self-Assembly of Microstructures—The State-of-the-Art", Journal of Microelectromechanical Systems, vol. 12, No. 4, Aug. 2003.

*Primary Examiner* — Nitin Parekh
(74) *Attorney, Agent, or Firm* — Dicke, Billig & Czaja, PLLC (57) ABSTRACT

The invention relates to a semiconductor device comprising through contacts through a plastic housing composition and a method for the production thereof. For this purpose, the wiring substrate has a solder deposit on which through contact elements are arranged vertically with respect to the wiring substrate and extend as far as the top side of the semiconductor device.

10 Claims, 6 Drawing Sheets

U.S. PATENT DOCUMENTS

| | | | | |
|---|---|---|---|---|
| 7,105,918 B2 * | 9/2006 | Lee | | 257/698 |
| 7,129,584 B2 * | 10/2006 | Lee | | 257/778 |
| 7,141,884 B2 * | 11/2006 | Kojima et al. | | 257/778 |
| 7,391,118 B2 * | 6/2008 | Tsai | | 257/778 |
| 7,670,876 B2 * | 3/2010 | Tsai | | 438/108 |
| 2002/0022302 A1 | 2/2002 | Hyoudo et al. | | |
| 2003/0156402 A1 * | 8/2003 | Ding et al. | | 361/820 |
| 2004/0145044 A1 | 7/2004 | Sugaya et al. | | |
| 2004/0222534 A1 | 11/2004 | Sawamoto et al. | | |
| 2006/0022333 A1 * | 2/2006 | Shivkumar et al. | | 257/723 |
| 2007/0040261 A1 | 2/2007 | Hetzel et al. | | |

FOREIGN PATENT DOCUMENTS

| | | |
|---|---|---|
| DE | 102004009056 | 9/2005 |
| DE | 102004010613 | 10/2005 |

* cited by examiner

SEMICONDUCTOR DEVICE HAVING THROUGH CONTACTS THROUGH A PLASTIC HOUSING COMPOSITION AND METHOD FOR THE PRODUCTION THEREOF

CROSS-REFERENCE TO RELATED APPLICATIONS

This Utility Patent Application claims the benefit of the filing date of German Application No. DE 10 2004 046 227.5, filed Sep. 22, 2004, and International Application No. PCT/DE2005/001652, filed Sep. 20, 2005, both of which are herein incorporated by reference.

BACKGROUND

The invention relates to a semiconductor device having through contacts through a plastic housing composition and method for the production thereof. Semiconductor devices having through contacts through a plastic housing composition are a prerequisite for stacking semiconductor devices to form semiconductor modules if the intention is to avoid complex intermediate wiring plates such as are known from the patent application DE 10 2004 010 613.2.

One possible solution consists in introducing passage holes into the finished plastic housing composition, into which the components such as semiconductor chips and connecting elements are embedded, for example by laser ablation and in filling the passage holes with conductive material or coating the inner walls of the holes with conductive material. This solution, or its implementation, is time-consuming and costly and requires a precise determination of the position of contact pads on a wiring substrate within the semiconductor device since the plastic housing composition already covers the wiring substrate.

Another solution, as known from the patent application DE 10 2004 009 056.4 proposes that, on a wiring substrate carrying a semiconductor chip, for example, large-volume solder balls be provided at predetermined locations on the wiring substrate, which solder balls extend from the wiring substrate as far as the surface of the semiconductor device and serve as through contacts. This solution requires disproportionately large solder balls, with the result that a wide contact pitch is required for the through-plating from semiconductor device to semiconductor device.

SUMMARY

It is an embodiment of the invention to specify a semiconductor device having through contacts through a plastic housing composition and a method for the production thereof which affords a cost-effective possibility of reliably realizing through contacts through plastic housing compositions and overcoming the problems in the prior art.

A method for the production of a semiconductor device having through contacts through its plastic housing composition has the following method processes. The first process involves producing a wiring substrate having a wiring structure. A semiconductor is arranged on the wiring substrate in a semiconductor chip position, the semiconductor being electrically connected to the wiring substrate. Afterward, solder deposits are applied to the wiring structure of the wiring substrate outside the semiconductor chip position. Wettable ends of metallic through contact elements are then placed onto the solder deposits. The wiring substrate is then heated to solder melting point of the solder deposits, the through contact elements, the wettable ends of which come into contact with the solder melt, being raised up into a position perpendicular to the surface of the wiring substrate.

After the solidification of the solder deposit, the wiring substrate then also has on its top side, alongside the semiconductor chip and the connections of the semiconductor chip to the wiring substrate, upright through contact elements which are connected to the semiconductor chip via the wiring structure of the wiring substrate. Afterward, a plastic housing composition is applied to the wiring substrate whilst embedding the semiconductor chip with its electrical connections and whilst encapsulating the through contact elements. The through contact elements are encapsulated to an extent such that free through contacts project from the plastic housing composition on the top side of the semiconductor device.

With this method, no openings whatsoever subsequently have to be introduced into the plastic housing composition in order to introduce through contacts into the finished openings. It is also not necessary to provide special rewiring or intermediate wiring plates in order to connect a through-plating of the connections on the underside of a semiconductor device to correspondingly arranged connections on the top side of the semiconductor device. By utilizing the surface tension of molten solder deposits it is possible, rather, to arrange a high number of pillar-type through contact elements actually prior to the application of the plastic housing composition on a wiring substrate and to envelop the through contacts into a plastic housing composition by a corresponding injection-molding method.

In one implementation of the method, the free ends of the through contacts on the top side of the plastic housing form external contact areas. As a result of the formation of the external contact areas, a further semiconductor device can then be stacked on this semiconductor device provided that the arrangement of the free ends of the passage elements on the top side corresponds to a corresponding arrangement of external contacts of a semiconductor device to be stacked. If that is not the case, then in a further implementation of the method free ends of the through contact elements on the top side of the plastic housing are connected to offset external contact areas via a corresponding wiring structure with corresponding conductor tracks. Consequently, the semiconductor device has a wiring structure not only within the plastic housing composition, namely on the wiring substrate, but also on its top side, the wiring structure on the top side serving to connect the free ends of the through contact elements to corresponding external contact areas that are offset relative to the through contact elements.

In a further exemplary implementation of the method of the invention, the solder deposits are applied on circular contact pads of the wiring structure of the wiring substrate. These circular contact pads of the wiring structure ensure that the solder deposits assume a hemispherical structure on the contact pads during the application of solder deposits. The hemispherical structure is defined by the surface tension of the liquid solder and acts on disturbances, such as a penetration of a wettable base surface of a passage element, in such a way that the disturbance is corrected until an energetically favorable and hence low-surface-tension position of the solder liquid drop is achieved again. This position is achieved when the surface of the solder attains its smallest areal extent, in the case of which the through contact element undergoes transition from, for example, a position on the wiring substrate to a vertical position with respect to the wiring substrate.

In a further exemplary implementation of the method, the length of the through contact elements is adapted to the thickness of the plastic housing composition. This prevents the plastic housing composition from also covering the free ends and thus the free end sides of the through contact elements and obstructing electrical contact-connection.

It is furthermore provided that a further semiconductor device is stacked on the semiconductor device and is electrically connected to the wiring structure on the top side of the semiconductor device by its external contacts being soldered onto the external contact areas of the semiconductor device. As a result of the necessary structuring of the device according to the invention, it is now possible to stack one semiconductor device on the other in an unproblematic manner.

In a further exemplary implementation of the method, prior to the application of the plastic housing composition to the wiring substrate, a semiconductor chip is applied by its flip-chip contacts to the wiring substrate, the flip-chip contacts being electrically connected to the solder deposits in the edge region of the wiring substrate via conductor tracks of the wiring structure. At the same time, via corresponding through contacts in the wiring substrate, the flip-chip contacts of the semiconductor chip are electrically connected to corresponding external contacts on the underside of the semiconductor device, thereby producing passage connections from the external contacts on the underside of the semiconductor device through to the external contact areas on the top side of the semiconductor device. As a result, contact pads of the semiconductor chip together with this continuous through connection form a connecting node in the semiconductor device.

A semiconductor device of this type may serve as a base semiconductor device of a semiconductor device stack or have on its top side additional passive components which are wired with the semiconductor chip within the plastic housing composition. In addition, provision is made for realizing at least one through contact by a passive device being raised up vertically on a solder deposit and its electrodes ensuring the electrical connection between top side and underside of the semiconductor. A three-dimensional integration of passive components is thus achieved at the same time.

To summarize, it can be stated that the invention solves the problem of providing through contacts through a plastic housing composition by a solder deposit being applied to a metallized contact pad of the wiring substrate. A solder deposit of this type may have a solder paste or a lead-free solder or similar substances. An edge of a wettable end of a metal lamina or of a passive component, as through contact element, is in each case positioned onto the solder deposit. For this purpose, the metal lamina includes a wetting part and a non-wetting part. For this purpose, the wetting part is directed onto the solder deposit.

When the soldering operation subsequently takes place, a positioned metal lamina or the passive component is raised up vertically. This effect is based on the reduction of the surface tension in a solder material drop. After the through contact elements have been raised up, the component can be encapsulated with the plastic housing composition in such a way that the top sides of the metal laminae or passive components project from the encapsulant or plastic housing composition. Protruding regions of the through contacts can be removed by a suitable removal method such as, for example, grinding, laser ablation or etching techniques. The same methods can also be applied if the free ends of the through contacts are covered by a plastic housing composition during the encapsulation process. In this case, too, the ends of the through contacts can then be uncovered by grinding, laser ablation or corresponding dissolution methods for the plastic.

One embodiment of the invention specifies a semiconductor device including a semiconductor chip and a wiring substrate in a plastic housing composition, wherein the wiring substrate has a wiring structure electrically connected to the semiconductor chip. The wiring substrate has solder deposits outside the semiconductor chip region. The solder deposits, too, are electrically connected to the semiconductor chip via the wiring structure. Wettable ends of metallic through contact elements are arranged in the solder deposits, the through contact elements extending through the plastic housing composition orthogonally with respect to the wiring substrate. The free through contact ends of the through contact elements, which are not arranged in the solder deposits, remain freely accessible from the top side of the semiconductor device and are not covered with plastic housing composition.

With this semiconductor device, it has through contacts which extend from the wiring substrate through the plastic housing composition as far as the top side of the semiconductor device and enable an electrical connection to be produced from the top side of the semiconductor device as far as the electrodes of the semiconductor chip. Consequently, this semiconductor device has electrical connections to the electrodes of an integrated circuit of the semiconductor chip both from the top side and from the underside and semiconductor devices of this type can be stacked one on top of another without great problems.

If the size and arrangement of the through contacts, or of the free through contact ends, deviates from the size and arrangement of external contacts of a semiconductor device to be stacked, then a wiring structure may be arranged on the top side of the semiconductor device in one embodiment of the invention. The wiring structure has conductor tracks from the freely accessible through contact ends to external contact areas, the external contact areas corresponding in terms of their size and arrangement to the size and arrangement of external contacts of a surface-mountable semiconductor device to be stacked.

On account of the through contacts according to one embodiment of the invention which take effect via solder deposits of a wiring substrate and corresponding through contact elements standing in the solder deposits on the top side of the semiconductor device, it is possible, with the aid of a further wiring structure on the top side of the semiconductor device, to adapt the arrangement and size of the external contact areas to any external contact pitch of a semiconductor device to be stacked. If the arrangement of the through contacts deviates from the arrangement of the external contacts on the underside of the semiconductor device, this wiring structure additionally makes it possible to adapt an adapted arrangement also to the pattern of the intrinsic external contacts on the underside of the semiconductor device. In this case, as many semiconductor devices of the same device type as desired can be arranged one above another to form a semiconductor circuit module. This is particularly necessary for semiconductor memory modules with a BGA (ball grid array) housing, especially as these housings are surface-mountable. The possibility of flexibly adapting the size and arrangement of external contact areas on the top side of the semiconductor device likewise makes it possible to combine a memory device with a logic device, and visa versa.

In a further embodiment of the invention, the through contact element has at least one end side which is oriented orthogonally with respect to the longitudinal axis of the through contact element. This orthogonal orientation of the longitudinal axis relative to the end side that is introduced into the solder deposit of the wiring substrate is a crucial prerequisite for the formation of the through contacts according to the invention. This is because if the end side deviates only slightly from orthogonality relative to the longitudinal axis, there is the risk of the through contact element being arranged crookedly, or at an angle of inclination, in the solder deposit and consequently also in the plastic housing composition, and therefore of the free end of the through contact element not appearing on the top side exactly at the position that would be provided for the passage element. This may lead to misalignments during the production of the semiconductor devices and thus also to the failure of the semiconductor devices. The permissible deviations from orthogonality between end side and longitudinal axis of the through contact elements are determined indirectly by the tolerance limits of the wiring structure on the top side of the semiconductor device since they can only be compensated for by the wiring structure arranged on the top side of the semiconductor device.

In a further embodiment of the invention, the through contact elements have a coating that cannot be occupied by liquid solder material on their lateral surfaces. The coating is applied to the lateral surfaces of the through contact elements before the through contact elements are positioned on the solder deposits. The non-wettable coating ensures that the through contact elements are independently oriented vertically in the solder deposit.

In a further embodiment of the invention, the through contact element may have a lateral surface which has a lateral surface region that can be wetted by liquid solder material in the region of at least one end surface of the through contact element. However, the areal extent of the lateral surface region is smaller than the area of the end side of the through contact element. This limitation of the wettable lateral surface region to an area which is smaller than the end side of the through contact element has the advantage that the through contact element can be constrained to a perpendicular orientation in a solder deposit during production on account of the surface tension of the liquefied solder deposit. There would otherwise be the risk of the through contact element having a crooked position or reverting completely to a horizontal position with its longitudinal axis.

At least one of the through contact elements is a passive device. A prerequisite for the passive device, if it is intended to be used as a through contact element, is that its electrodes can be wetted by liquid solder material on the end sides. It is thus possible for the passive components to be raised up with their longitudinal axis perpendicular to the wiring substrate and to be arranged with this orientation in the plastic housing composition of the semiconductor device. For these passive devices, too, it holds true that the larger the wettable end-side surface relative to a wettable partial region of the lateral surface of the passive devices, the more securely and more reliably the passive device can be arranged with its longitudinal axis vertically in the plastic housing composition and be integrated three-dimensionally into the semiconductor device.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2 to 5 show schematic cross sections of components during the production of a semiconductor device of a second embodiment of the invention.

FIGS. 6 to 9 show cross sections of components during the production of a semiconductor device in accordance with a third embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
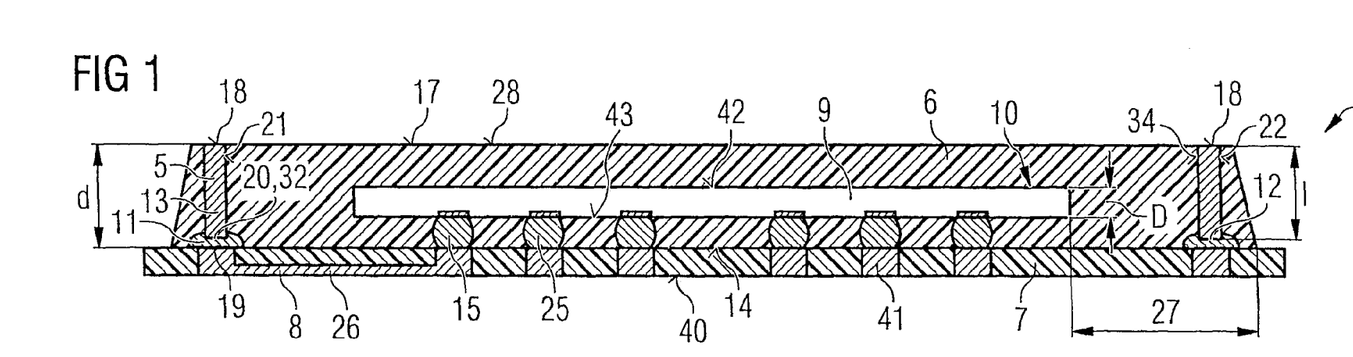
FIG. 1 illustrates a schematic cross section through a semiconductor device in accordance with the first embodiment of the invention.

FIG. 1 illustrates a schematic cross section through a semiconductor device 1 in accordance with a first embodiment of the invention. The semiconductor device 1 has a semiconductor chip 9 arranged by flip-chip contacts 25 as electrical connecting elements 15 on a wiring structure 8 of a wiring substrate 7. An edge region 27 of the wiring substrate 7 surrounds a semiconductor chip position 10 in which the semiconductor chip 9 is arranged on the wiring substrate 7. On the edge region 27 solder deposits 11 are arranged on contact pads 19 of the wiring structure 8. In the solder deposits 11, through contact elements 13 stand with their base surfaces 20 vertically on the wiring substrate 7.

The through contact elements 13 have ends 12 which are wettable for liquid solder material and by which they are arranged in the solder deposits 11. The free ends 16 of the through contact elements 13 reach as far as the top side 17 of the plastic housing composition 6, which is simultaneously the top side 28 of the semiconductor device 1 in this embodiment. The through contact elements 13 thus form through contacts 5 from the top side 17 of the plastic housing composition as far as the underside 40 of the semiconductor device 1.

The thickness d of the plastic housing composition 6 corresponds to the length l of the through contact elements 13. The lateral surface 34 or the other surfaces 21 of the through contact elements 13 which are encapsulated by the plastic housing composition 6 have a coating 22 that is not wettable by liquid solder material. What is thereby achieved is that the through contact 13 can be wetted by the composition of the solder deposit 11 primarily on its base surface 20, or its end side 32, and is raised up under the action of temperature from a horizontal position on the wiring substrate 7 to a vertical position relative to the wiring substrate 7.

Such a semiconductor device 1 in the first embodiment of the invention can be produced cost-effectively, especially as fitting the through contacts 5 merely requires placing metal laminae onto the solder deposits 11 before the solder deposits 11 are melted. If the solder deposit includes a solder paste, then the wettable ends 12 of the through contact elements 13 can be inserted into the solder paste without being displaced until the through contact elements 13 are constrained to be raised up as a result of the solder paste melting.

Between the through contact elements 13 and the external contacts (not shown) of the semiconductor device 1, and also the flip-chip contacts 25 of the semiconductor chip 9, there is an electrical connection via the wiring substrate 7 and the wiring structure 8 arranged thereon, which connection is partly also achieved via through contacts 41 through the wiring substrate 7. The through contacts 41 connect the contact pads of the solder deposits 11 that are equipped with through contact elements 13 via conductor tracks 26. The free through contact ends 16 on the top side 17 of the plastic housing composition 6 can already be utilized as external contact area 18 on the top side 28 of the plastic housing in order either to connect passive devices on the top side 28 of the semiconductor device 1 to the circuit structure of the semiconductor chip 9 or to receive external contacts of a semiconductor device to be stacked. This stacked semiconductor device may be a semiconductor device identical to that illustrated in FIG. 1. For this purpose, it is necessary merely to correspondingly provide solder balls as external contacts in the edge region 27 or the semiconductor device has to be modified in the manner illustrated in FIG. 9.

FIGS. 2 to 5 show schematic cross sections through components during the production of a semiconductor device 2 of a second embodiment of the invention.

Figures 2, 3:
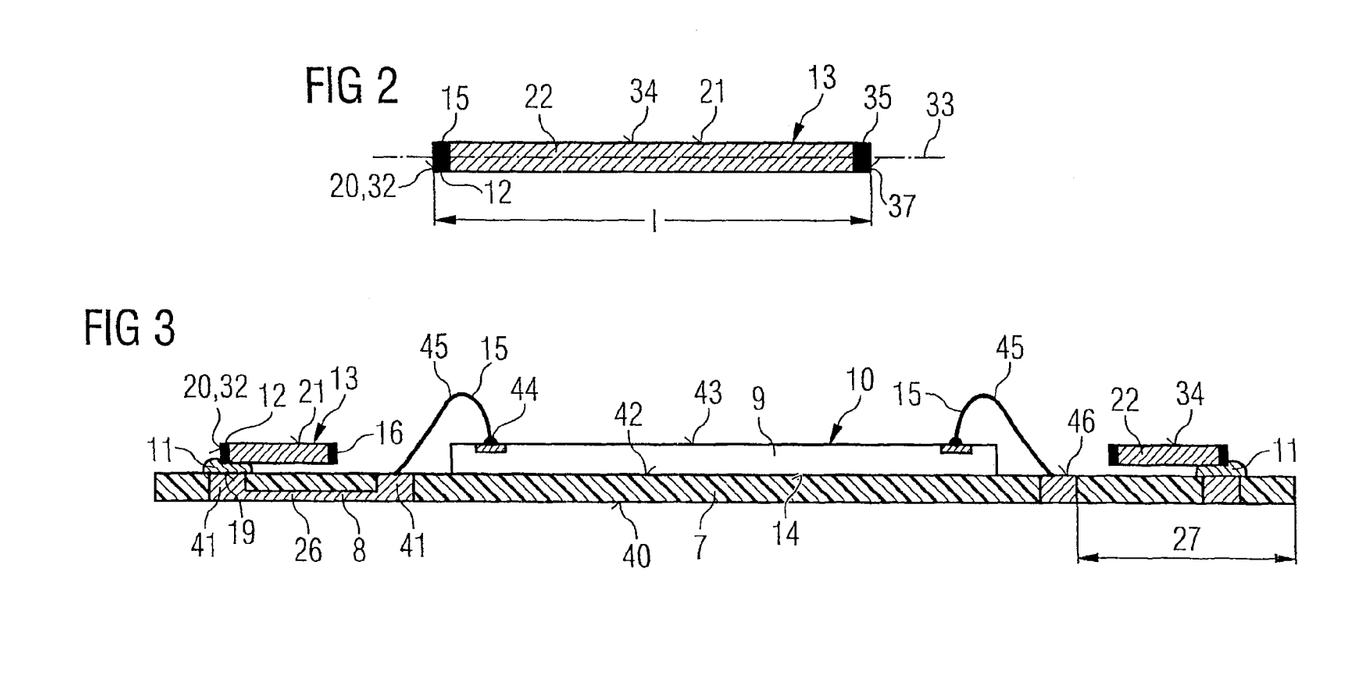
FIG. 2 illustrates a schematic cross section through a through contact element.
FIG. 3 illustrates a schematic cross section through a wiring substrate with solder deposit.

FIG. 2 illustrates a schematic cross section through a through contact element 13 having a longitudinal axis 33 and a length l. End surfaces 32 and 37 are arranged orthogonally with respect to the longitudinal axis 33. One of the end surfaces 32 or 37 forms the base surface 20 of the through contact element 13 and has a wettable surface. The lateral surface 34 of the through contact element 13 is partly coated with a non-wetting coating 22.

In this embodiment of the through contact element 13, the latter has a wettable lateral surface region 35. The areal extent of this lateral surface region 35 which can be wetted by liquid solder material is smaller than the end surface 32 or base surface 20. This ratio is necessary in order to ensure that the through contact area 13 is raised up in a liquid solder deposit as soon as the solder deposit touches the wettable surfaces of the through contact element 13. If the situation were the other way around, the through contact element 13 would remain in the horizontal position illustrated here and would not stand up perpendicularly. Precise orthogonality between longitudinal axis 33 and end side 32 or base surface 20 is also crucial for the functioning of the through contact element 13 since, in the event of slight deviation from orthogonality, the through contact element 13 would be raised up obliquely or in inclined fashion with respect to a wiring substrate and would remain in this inclined or oblique position. Therefore, increased accuracy must be demanded of the production of the end side 32 or the base side 20 of the through contact element 13.

FIG. 3 illustrates a schematic cross section through a wiring substrate 7 with a solder deposit 11. On the top side 14 of the wiring substrate 7, the semiconductor chip 9 is arranged by its rear side 42 in a semiconductor chip position 10. The active top side of the semiconductor chip 43 has contact areas 44 which are electrically connected to bonding areas 46 of the wiring structure 8 of the wiring substrate 7 via bonding wires 45 as electrical connections 15. The bonding areas 46 for their part, are connected via the wiring structure 8 with corresponding through contacts 41 to contact pads 19 with solder deposits 11.

The through contact element 13 is placed onto the solder deposit 11 by its wettable end 12 and is situated with its longitudinal axis in a virtually horizontal position approximately parallel to the wiring substrate 7. If the wiring substrate 7 is heated to soldering temperature in the region of the solder deposit 11, then the solder deposit 11 liquefies and, on account of the surface tension of the solder liquid and the wetting properties of the base surface 12 of the through contact element 13, the through contact element 13 is raised up from the horizontal position illustrated in FIG. 3 into the perpendicular position relative to the wiring substrate 7 as illustrated in FIG. 4.

Figure 4:
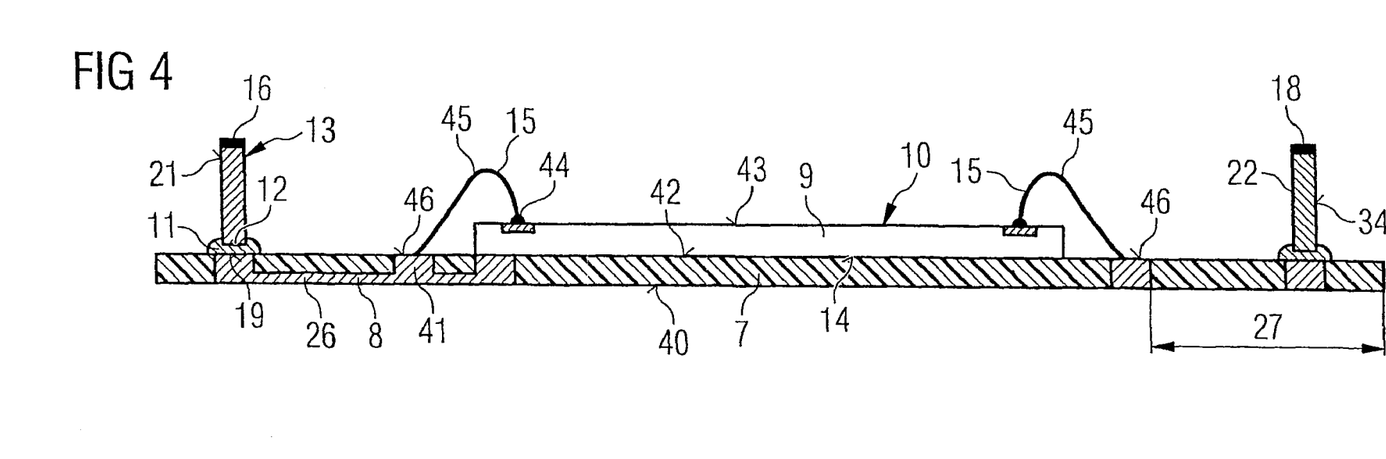
FIG. 4 illustrates a schematic cross section through the wiring substrate from FIG. 3 after the through contact elements have been raised up.

FIG. 4 illustrates a schematic cross section through the wiring substrate from FIG. 3 after the through contact elements 13 have been raised up in this way. Components having the same functions as in the previous figures are with the same reference symbols not discussed separately.

Figure 5:
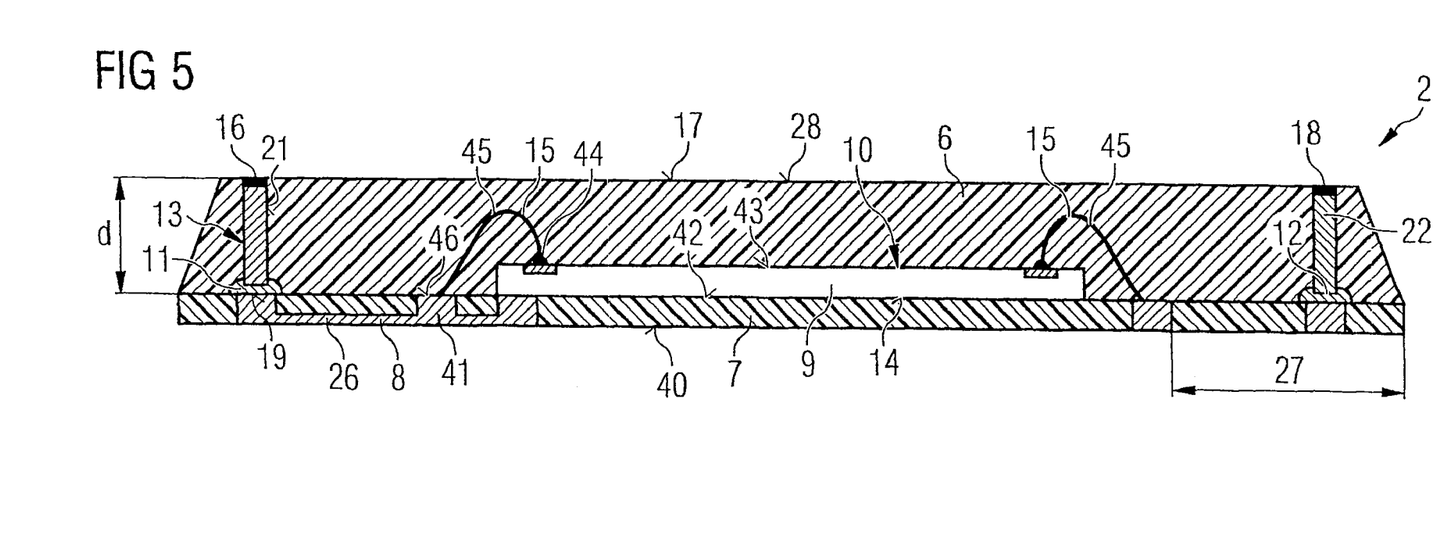
FIG. 5 illustrates a schematic cross section through a semiconductor device in accordance with a second embodiment of the invention after the application of a plastic housing composition.

FIG. 5 illustrates a schematic cross section through a semiconductor device 2 in accordance with a second embodiment of the invention after the application of a plastic housing composition 6. The through contact elements 13 now extend through the plastic housing composition 6 having a thickness d and form with their free through contact ends 16 on the top side 17 of the housing plastic composition 6 an external contact area 18 which can be accessed from the top side 28 of the semiconductor device 2.

FIGS. 6 to 9 show schematic cross sections of components during the production of a semiconductor device 3 in accordance with a third embodiment of the invention. Components having the same functions as in the previous figures are identified by the same reference symbols in FIGS. 6 to 9 and are not discussed separately.

Figure 6:
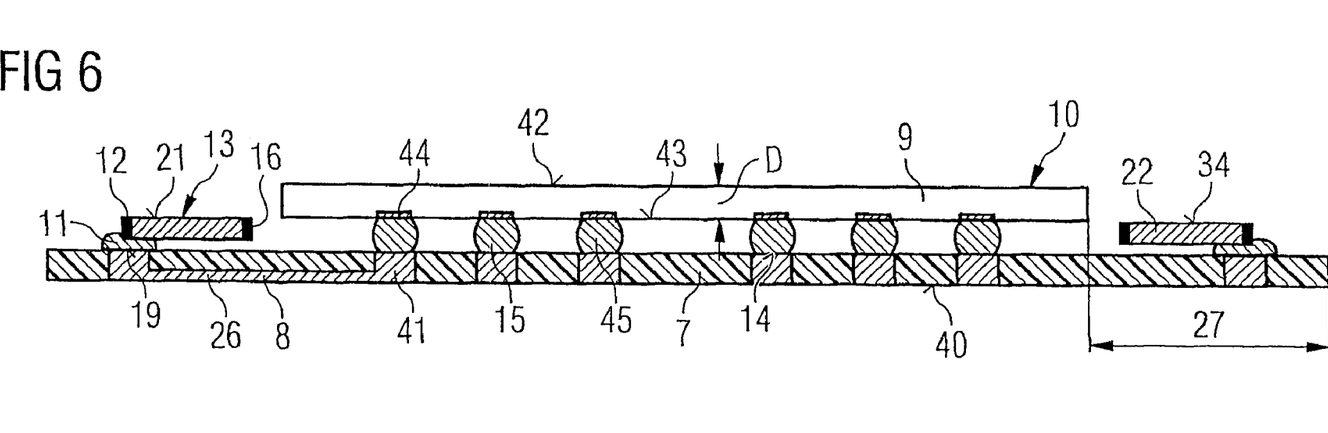
FIG. 6 illustrates a schematic cross section of a wiring substrate after the application of a semiconductor chip with flip-chip contacts.

FIG. 6 illustrates a schematic cross section of a wiring substrate 7 after the application of a semiconductor chip 9 with flip-chip contacts 25. The flip-chip contacts 25 are arranged on contact areas 44 on the active top side 43 of the semiconductor chip 9. The flip-chip contacts 25 are connected to a solder deposit 11 via through contacts 41 of the wiring substrate 7 and via conductor tracks 8 of the wiring structure 26. A through contact element 13 is in each case arranged on the solder deposits 11 by a wettable end 12. The through contact element 13 is here still in a virtually horizontal position and is raised up into a vertical position with respect to the wiring structure 7 by the heating of the wiring substrate 7 in the region of the solder deposit 11 on account of the effect of the surface tension of the solder deposit that liquefies and on account of the wetability of the base surface 20 of the through contact element 13.

Figure 7:
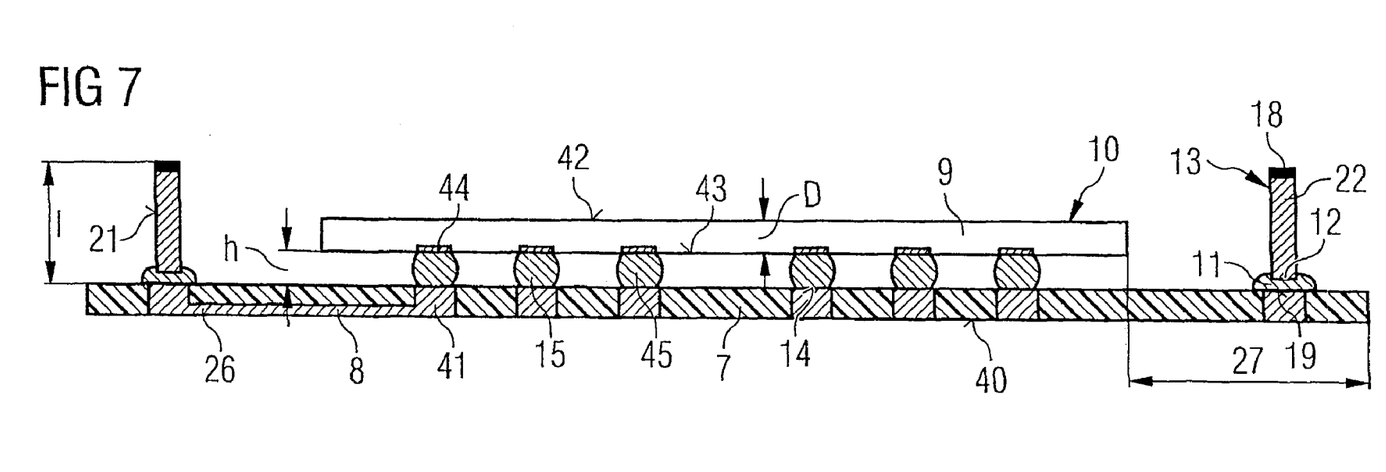
FIG. 7 illustrates a schematic cross section of the wiring substrate from FIG. 6 after through contact elements have been raised up.

FIG. 7 illustrates a schematic cross section of the wiring substrate 7 in accordance with FIG. 6 after the through contact elements 13 have been raised up. The length l of the through contact elements 13 is dimensioned such that it is greater than the thickness D of the semiconductor chip together with the height h of the flip-chip contacts. Consequently, the through contact elements 13 project above the rear side 42 of the semiconductor chip 9 on the wiring substrate 7.

Figure 8:
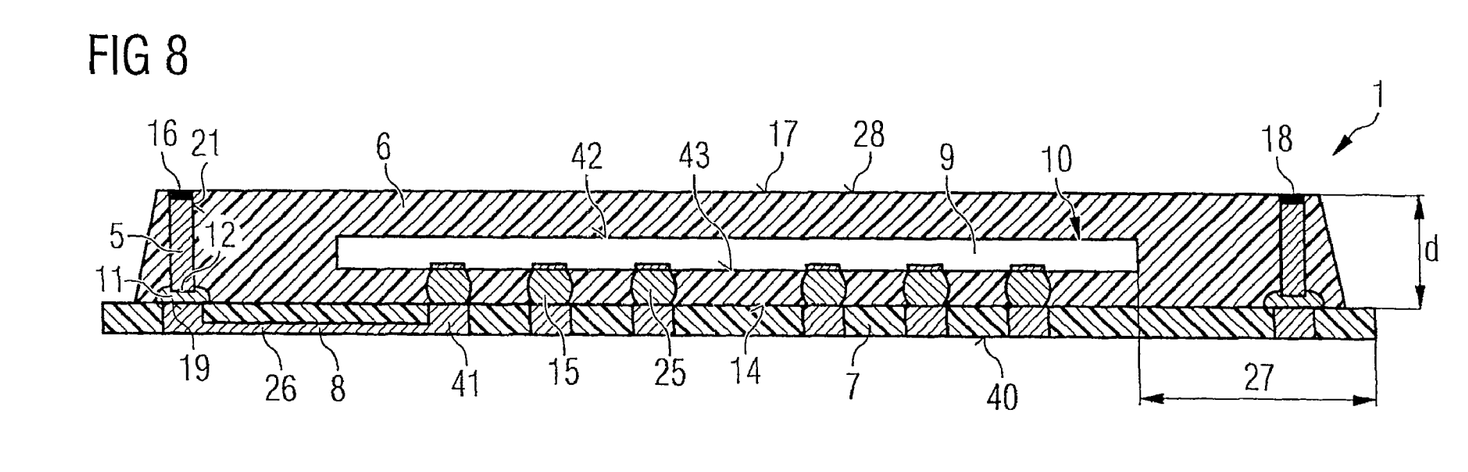
FIG. 8 illustrates a schematic cross section through a semiconductor device in accordance with FIG. 1 after the application of a plastic housing composition to the wiring substrate from FIG. 7.

FIG. 8 illustrates a schematic cross section through a semiconductor device 1 in accordance with FIG. 1 after the application of a plastic housing composition to the wiring substrate 7 from FIG. 7.

Figure 9:
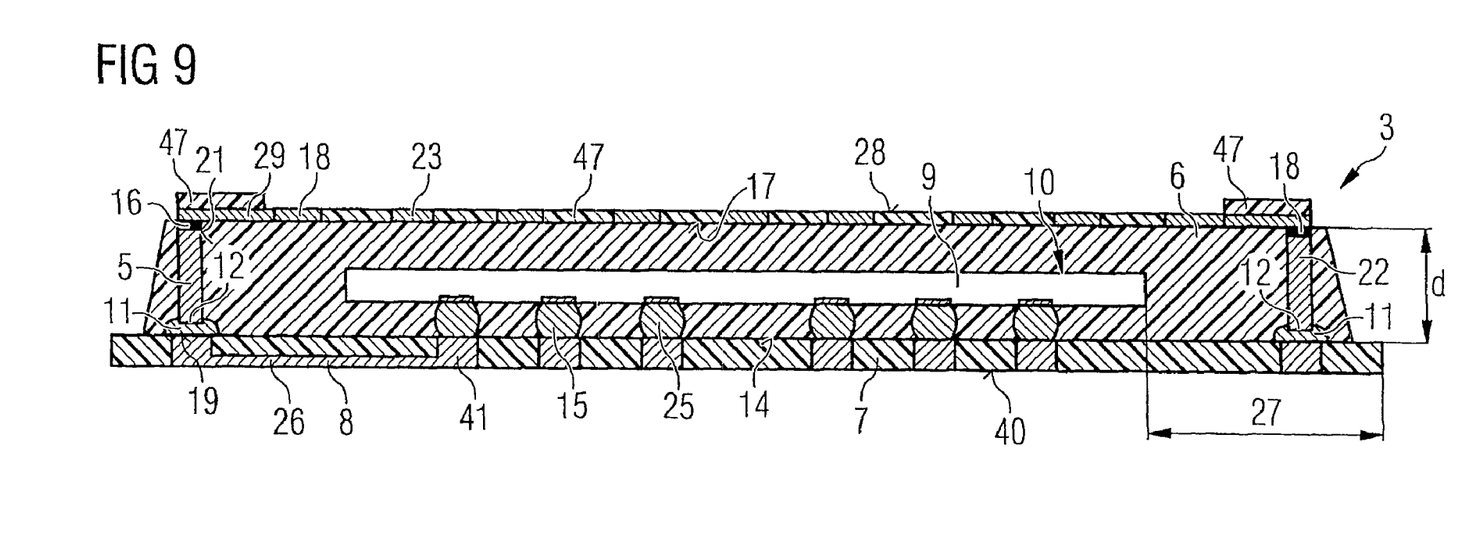
FIG. 9 illustrates a schematic cross section through a semiconductor device of a third embodiment of the invention after the application of a wiring structure to the top side of the semiconductor device from FIG. 8.

FIG. 9 illustrates a schematic cross section through a semiconductor device 3 of a third embodiment of the invention after the application of a wiring structure 23 to the top side of the semiconductor device 3 in addition to the wiring structure 8 of the wiring substrate 7 already present. By the wiring structure 23, it is now possible to produce, via conductor tracks 29, external contacts 31 which can be adapted in terms of their size and arrangement to the size and arrangement of a semiconductor device to be stacked. The wiring structure 23 is covered by a soldering resist layer 47, which only leaves the external contact areas 31 free. Consequently, the semiconductor device 3 is ideally suitable as a base semiconductor device 3 for a stacking of semiconductor devices.

Figure 10:
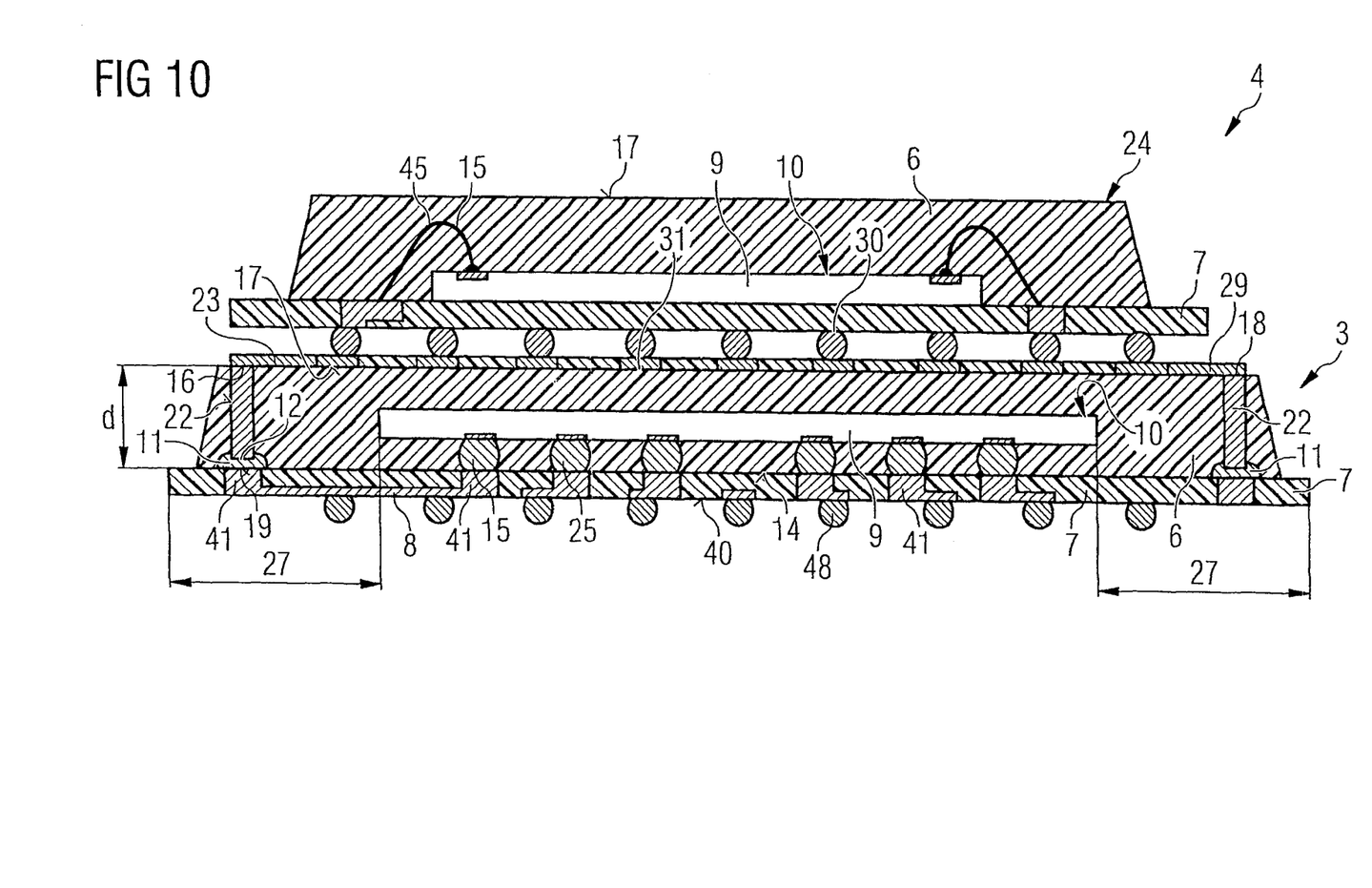
FIG. 10 illustrates a schematic cross section through a semiconductor device in accordance with a fourth embodiment of the invention.

FIG. 10 illustrates a schematic cross section through a semiconductor device 4 in accordance with a fourth embodiment of the invention. The semiconductor device 4 constitutes a semiconductor device stack including a base semiconductor device 3 and a stacked semiconductor device 24. The stacked semiconductor device 24 is arranged by its external contacts 30 on the external contact areas 31 on the top side 28 of the semiconductor base device 3. The semiconductor base device 3 corresponds to the semiconductor device illustrated in FIG. 9 and additionally has external contacts 48 in the form of solder balls on its underside 40. The stacked semiconductor device 24 differs from the semiconductor devices discussed above by virtue of the fact that is has no through contact elements whatsoever through its plastic housing composition 6. Its structure otherwise corresponds to the semiconductor device 2 illustrated by FIG. 5.

Figure 11:
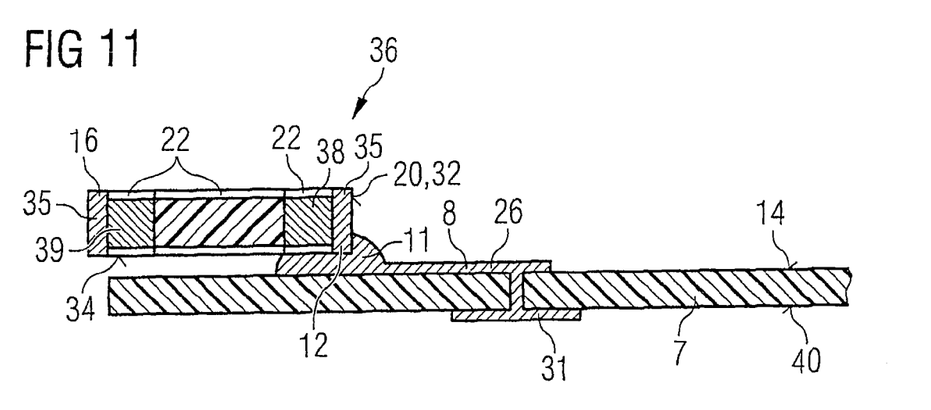
FIG. 11 illustrates a schematic cross section through a passive device provided as through contact element.

FIG. 11 illustrates a schematic cross section through a passive device 36 with electrodes 38 and 39 opposite one another and is provided as through contact element 13. The passive device 36 is arranged here virtually horizontally with its longitudinal axis 33 on a wiring substrate 7 and its electrode 38 touches a solder deposit 11. The electrode 38 is partly covered with a non-wetting coating 22, with the result that a wettable region 35 has an areal extent which is smaller than the wettable base surface 20 on the end side 32 of the passive device 36. This ratio ensures that when the solder deposit 11 is melted, the passive device 36 is raised up vertically with respect to the wiring substrate 7. This state is illustrated in FIG. 12.

Figure 12:
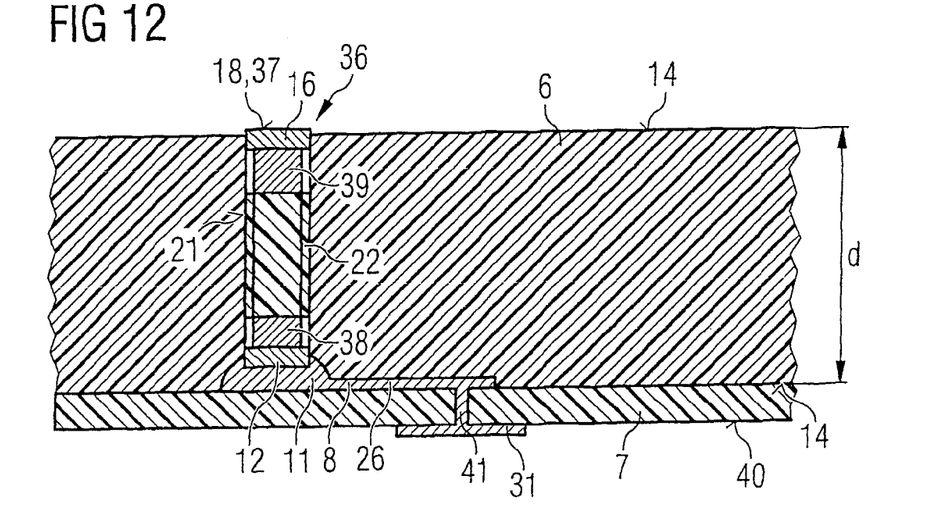
FIG. 12 illustrates a schematic cross section through the passive device from FIG. 11 after being raised up vertically in a solder deposit.

FIG. 12 illustrates a schematic cross section through the passive device 36 after being raised up vertically in a solder deposit 11. The solder deposit 11 is connected to an external contact area 31 on the underside 40 of the wiring substrate 7 via conductor tracks 26 of a wiring structure 8 of the wiring substrate 7 and a through contact 41 through the wiring substrate 7. Consequently, electrical connection extends from the underside 40 of the wiring substrate 7 as far as the top side 17 of the plastic housing composition 6 via the passive device 36, which is used here as through contact element 13 and thus constitutes a three-dimensional integration of a passive device 36 in the plastic housing composition 6 of a semiconductor device. Passive devices 36 of this type are used for impedance matching and/or for decoupling inputs and outputs of stacked semiconductor devices and are resistors or capacitors such as coupling capacitors for radio frequency modules. Coils can also be used as through contacts in semiconductor devices, for example in order to block high-frequency stray signals.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device comprising:
   a semiconductor chip in a plastic housing composition;
   a wiring substrate on the plastic housing composition;
   wherein the wiring substrate has a wiring structure electrically connected to the semiconductor chip, and the wiring substrate has, outside a body of the semiconductor chip, solder deposits electrically connected to the semiconductor chip via the wiring structure;
   wherein wettable ends of metallic through contact elements are arranged in the solder deposits such that the through contact elements extend through the plastic housing composition orthogonally with respect to the wiring substrate such that free through contact ends of the through contact elements are freely accessible on a top side of the semiconductor device.

2. The semiconductor device of claim 1, wherein the top side of the semiconductor device has a wiring structure with conductor tracks from the freely accessible through contact ends to external contact areas, the external contact areas corresponding in terms of their size and arrangement to the size and arrangement of external contacts of a surface-mountable semiconductor device to be stacked.

3. The semiconductor device of claim 1, wherein the through contact element has at least one end side which is oriented orthogonally with respect to the longitudinal axis of the through contact element.

4. The semiconductor device of claim 3, wherein the through contact element has a lateral surface which cannot be wetted by liquid solder material.

5. The semiconductor device of claim 1, wherein the through contact element has a lateral surface which has, in the region of at least one end surface of the through contact element, a lateral surface region which can be wetted by liquid solder material and the areal extent of which is less than the area of the end side.

6. The semiconductor device of claim 1, wherein, at least one of the through contact elements is a passive device.

7. The semiconductor device of claim 6, wherein the passive device has electrodes which can be wetted by liquid solder material on its end sides and is oriented with its longitudinal axis vertically in the plastic housing composition of the semiconductor device.

8. A semiconductor device comprising:
a wiring substrate;
a semiconductor chip in a plastic housing;
a wiring structure electrically coupling the wiring substrate and the semiconductor chip;
a solder deposit on the wiring substrate coupled to the semiconductor chip via the wiring structure; and
contact means arranged vertically with respect to the wiring substrate and extending to a top surface of the semiconductor device such that the contact means is freely accessible on the top surface, wherein the contact means comprise a through contact element with a wettable ends arranged in the solder deposits.

9. The semiconductor device of claim 8, wherein the top side of the semiconductor device has a wiring structure with conductor tracks from the freely accessible through contact ends to external contact areas, the external contact areas corresponding in terms of their size and arrangement to the size and arrangement of external contacts of a surface-mountable semiconductor device to be stacked.

10. The semiconductor device of claim 8, wherein the through contact element has at least one end side which is oriented orthogonally with respect to the longitudinal axis of the through contact element.

* * * * *